US008344478B2

(12) United States Patent
Ellul et al.

(10) Patent No.: US 8,344,478 B2
(45) Date of Patent: Jan. 1, 2013

(54) INDUCTORS HAVING INDUCTOR AXIS PARALLEL TO SUBSTRATE SURFACE

(75) Inventors: Joseph P. Ellul, San Jose, CA (US); Khanh Tran, Milpitas, CA (US); Edward Martin Godshalk, Newberg, OR (US); Albert Bergemont, Palo Alto, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 127 days.

(21) Appl. No.: 12/605,010

(22) Filed: Oct. 23, 2009

(65) Prior Publication Data

US 2011/0095395 A1 Apr. 28, 2011

(51) Int. Cl.
*H01L 21/768* (2006.01)
*H01L 29/86* (2006.01)

(52) U.S. Cl. ............... 257/531; 257/585; 257/E21.585; 257/E29.325; 438/622

(58) Field of Classification Search ............... 257/531, 257/E21.585, E29.325; 438/622
See application file for complete search history.

(56) References Cited

U.S. PATENT DOCUMENTS

| 7,253,712 | B1 | 8/2007 | Papananos | |
|---|---|---|---|---|
| 2002/0005565 | A1* | 1/2002 | Forbes et al. | 257/531 |
| 2005/0024176 | A1* | 2/2005 | Wang et al. | 336/200 |
| 2007/0085648 | A1* | 4/2007 | Lee et al. | 336/200 |
| 2007/0247269 | A1 | 10/2007 | Papananos | |

OTHER PUBLICATIONS

Burghartz, Joachim N., et al., "Microwave Inductors and Capacitors in Standard Multilevel Interconnect Silicon Technology", *IEEE Trans. on Microwave Theory and Tech.*, vol. 44, No. 1, (Jan. 1996), pp. 100-104.
Cao, Yu, et al., "Frequency-Independent Equivalent Circuit Model for On-chip Spiral Inductors", *IEEE 2002 Custom Integrated Circuits Conference*, (Jun. 2002), pp. 217-220.
EO, Yungseon, et al., "High-Speed VLSI Interconnect Modeling Based on S-Parameter Measurements", *IEEE Trans. on Components, Hybrids, and Manufacturing Tech.*, vol. 16, No. 5, (Aug. 1993), pp. 555-562.
Lakdawala, H., et al., "Micromachined High-Q Inductors in 0.18µm Cu Interconnect Low-K CMOS", *IEEE 2001 Custom Integrated Circuits Conference*, (2001), pp. 579-582.
Mohan, Sunderarajan S., et al., "Simple Accurate Expressions for Planar Spiral Inductances", *IEEE Journal of Solid-State Circuits*, vol. 34, No. 10, (Oct. 1999), pp. 1419-1424.
Murgatroyd, Paul N., "The Optimal Form for Careless Inductors", *IEEE Trans. On Magnetics*, vol. 25, No. 3, (May 1989), pp. 2670-2677.
Yoon, Jun-Bo, et al., "Surface Micromachined Solenoid On-Si and On-Glass Inductors for RF Applications", *IEEE Electron Device Letters*, vol. 20, No. 9, (Sep. 1999), pp. 487-489.
Young, Darrin J., et al., "A Low-Noise RF Voltage-Controlled Oscillator Using On-Chip High-Q Three-Dimensional Coil Inductor and Micromachined Variable Capacitor", *Digest of Solid-State Sensor and Actuator Workshop*, (Jun. 1998), pp. 128-131.

* cited by examiner

*Primary Examiner* — Lynne Gurley
*Assistant Examiner* — Vernon P Webb
(74) *Attorney, Agent, or Firm* — Blakely Sokoloff Taylor & Zafman LLP

(57) ABSTRACT

Inductors and methods for integrated circuits that result in inductors of a size compatible with integrated circuits, allowing the fabrication of inductors, with or without additional circuitry on a first wafer and the bonding of that wafer to a second wafer without wasting of wafer area. The inductors in the first wafer are comprised of coils formed by conductors at each surface of the first wafer coupled to conductors in holes passing through the first wafer. Various embodiments are disclosed.

16 Claims, 13 Drawing Sheets

INDUCTORS HAVING INDUCTOR AXIS PARALLEL TO SUBSTRATE SURFACE

BACKGROUND OF THE INVENTION

1. Field of the Invention

The present invention relates to the field of integrated circuits, and more specifically, integrated circuits with passive elements which include inductors.

2. Prior Art

Integrated circuits normally comprise not just a combination of active devices (transistors), but also the interconnection of the active devices with passive devices such as resistors, capacitors and inductors. Resistors are relatively easily formed as part of the integrated circuit, with physical sizes being generally comparable to the physical sizes of the active devices. Similarly, techniques are known for forming relatively small capacitors of relatively low capacitance as part of an integrated circuit. Historically capacitors of a larger capacitance and inductors have generally not been part of the integrated circuit, but instead have been incorporated in passive circuitry off the integrated circuit chip and coupled to the chip as necessary. In many such circuits, the integrated circuit is by far the smallest part of the overall circuit, and is relatively dwarfed by the size of the off-chip passive devices. Further, the required connections to the passive devices usually require a substantial increase in the number of input and output pins on the integrated circuit, which in turn increases the size of the required chip.

More recently some inductors have been formed on chip as part of the integrated circuit, though at the expense of substantial chip area. In particular, whether formed on the integrated circuit or as part of separate passive circuitry, inductors are normally formed in what will be referred to herein as a two-dimensional structure, namely, as spiral windings insulated from and in a plane parallel to the face of the chip. In at least some instances second and third layers of the windings are also provided, each insulated from the other and interconnected by vias through the insulative layers.

FIG. 1 is a face view of an RF transceiver circuit comprising a flip chip assembly of an integrated circuit 20 on a passive circuit 22, each of which includes such two-dimensional inductors. In particular, the integrated circuit 20 includes two two-dimensional inductors 24 and the passive circuit 22 also includes two two-dimensional inductors 26. It is apparent that the two-dimensional inductors 24 on the integrated circuit occupy a significant fraction of the chip area, not only because of their size but because the magnetic fields generated thereby can adversely affect linear circuitry that is too close to the inductors. Similarly, inductors 26 utilize an area as large as, or perhaps even larger than, the entire integrated circuit itself. The net result of this assembly is that an integrated circuit chip of 1.91 millimeters by 1.91 millimeters is mounted on a substrate with passive circuitry having dimensions of 4.99 millimeters by 4.99 millimeters, or approximately 6.8 times the area of the integrated circuit itself, with the final package having dimensions of 6 by 6 by 0.85 millimeters, over 9 times the area of the integrated circuit itself.

DETAILED DESCRIPTION OF THE PREFERRED EMBODIMENTS

In the Figures referred to in the description to follow, such Figures are far from being scaled Figures, but instead are drawn with certain dimensions relatively exaggerated and others relatively compressed so as to better illustrate the fabrication process. In most cases, suitable dimensions will be obvious to those skilled in the art, and in other cases where important or unique to the present invention, representative dimensions will be given.

Figure 1:
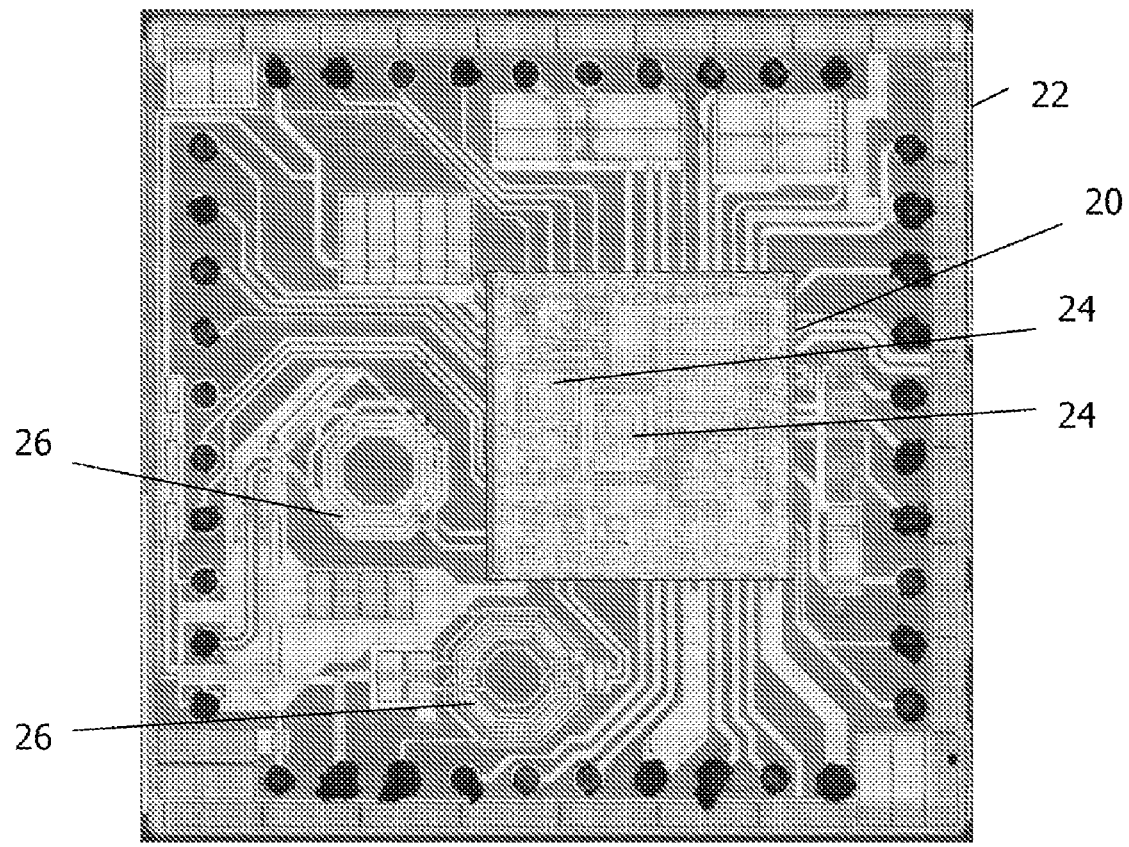
FIG. 1 is a view of a prior art integrated circuit, which circuit includes inductors on the integrated circuit, all mounted on a passive device circuit packaged therewith.
Figure 2:
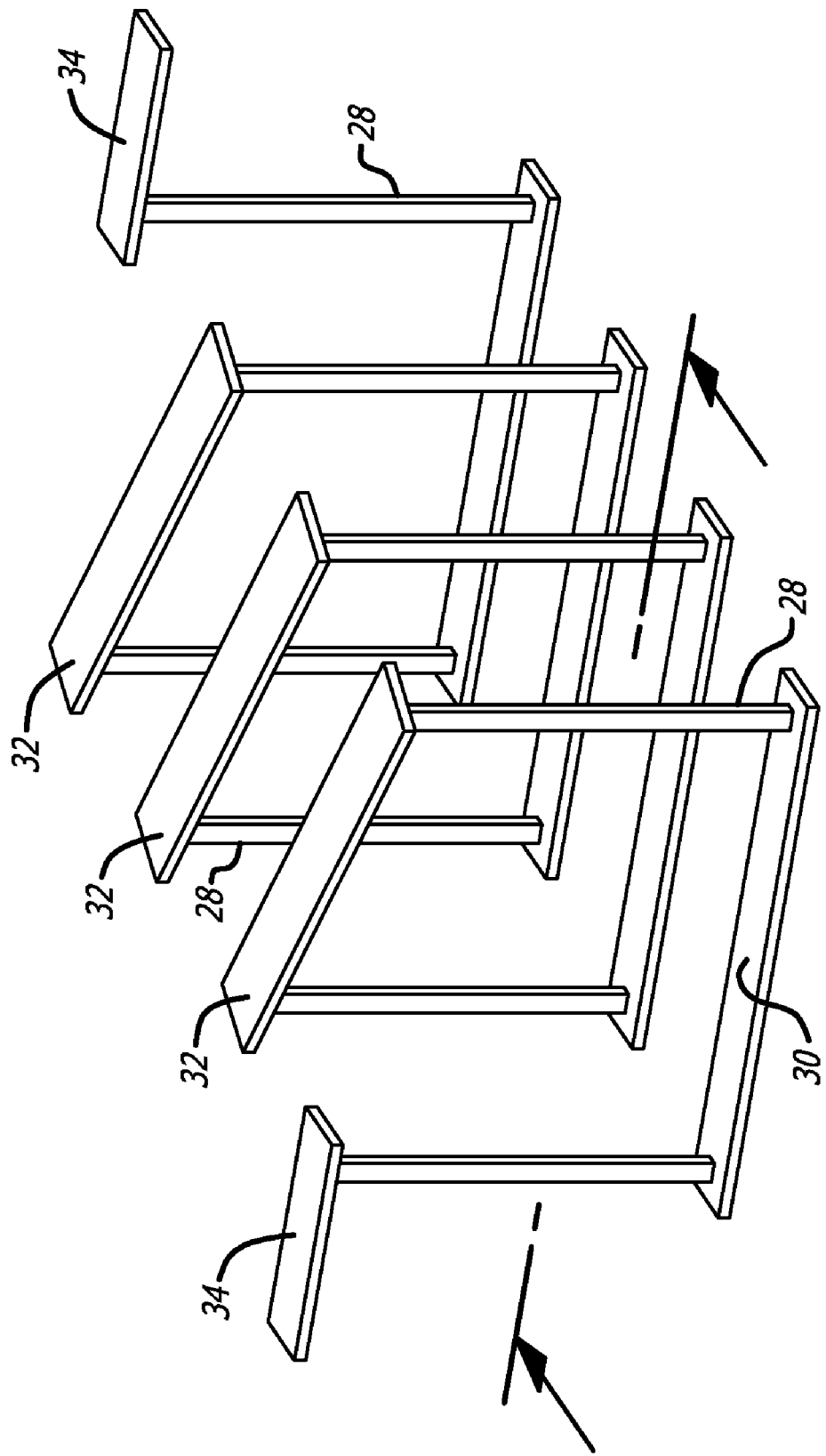
FIGS. 2 through 31 are local cross sections of a wafer illustrating the partial fabrication of an inductor in accordance with an embodiment of the present invention.

Now referring to FIG. 2, a schematic illustration of an inductor formed by the methods of the present invention may be seen. The inductor is formed by the interconnection of vertical members 28 and horizontal members 30 and 32 to form a continuous coil-like structure between contacts 34. Obviously the number of turns may be increased or decreased as desired. Also, one of the contacts 34 may be brought out at the lower level of the coil by adding or subtracting half a turn, or both contacts might be brought out at the lower level by simply turning over the structure illustrated. The process for fabricating the coil as described below is illustrated by representative cross sections taken along the view plane of FIG. 2 for specificity in the description. That specificity however is not a limitation of the invention.

Figure 3:
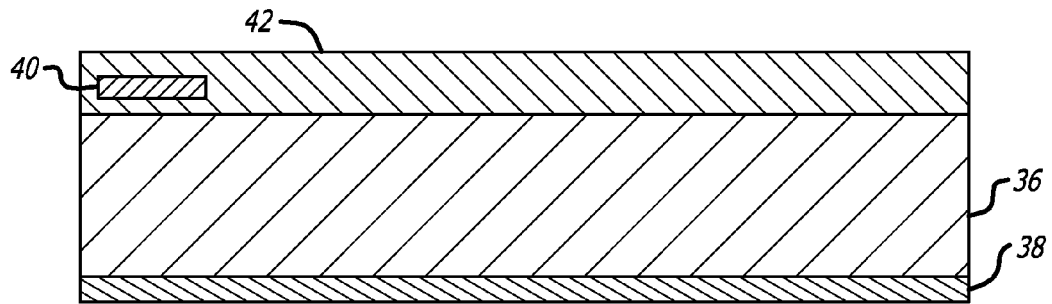

Now referring to FIG. 3, a silicon substrate 36 may be seen. The substrate has a backside oxide layer 38 and integrated circuit devices formed on the top surface thereof with interconnect metal layers schematically illustrated as interconnect metal layer 40, all within various oxide layers 42. This structure would be formed by typical integrated circuit fabrication techniques and may comprise any of a wide variety of circuits, depending on the application. Preferably the substrate is a wafer size substrate, i.e., with which multiple devices will be formed and later diced to separate the multiple devices.

Figure 4:
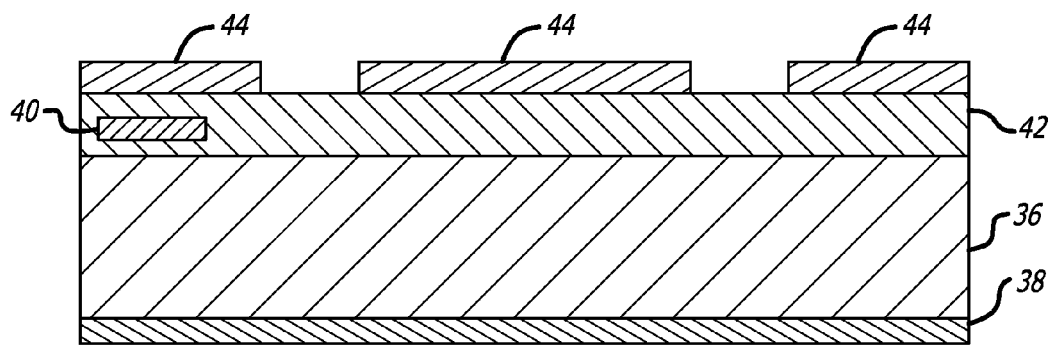
Figure 5:
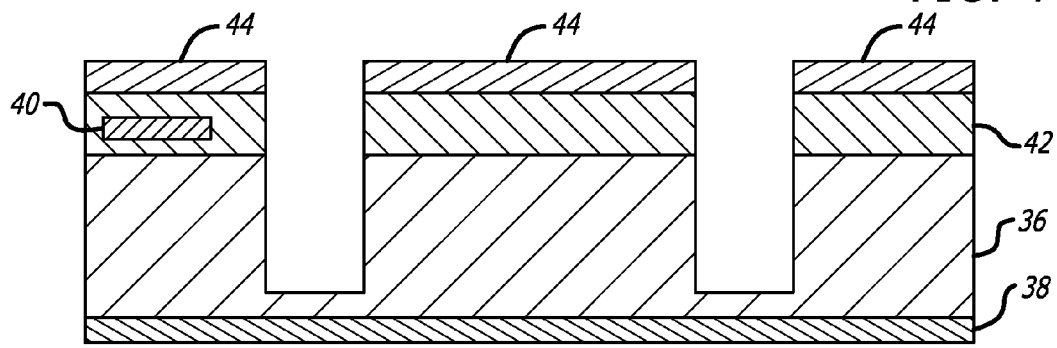
Figure 6:
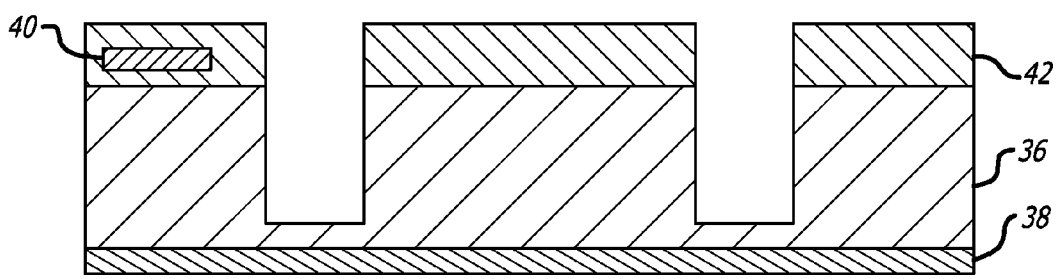
Figure 7:
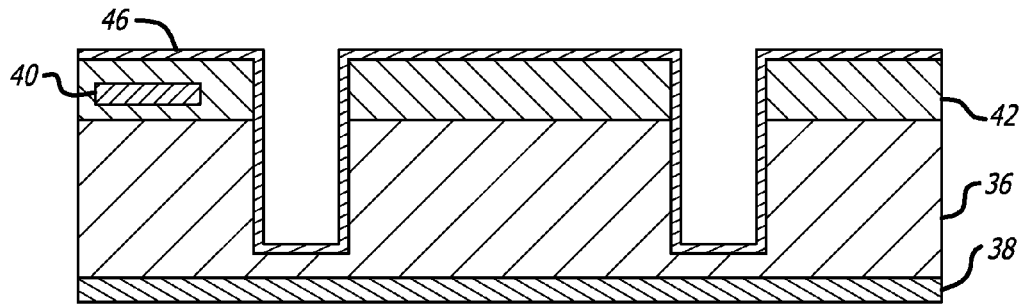
Figure 8:
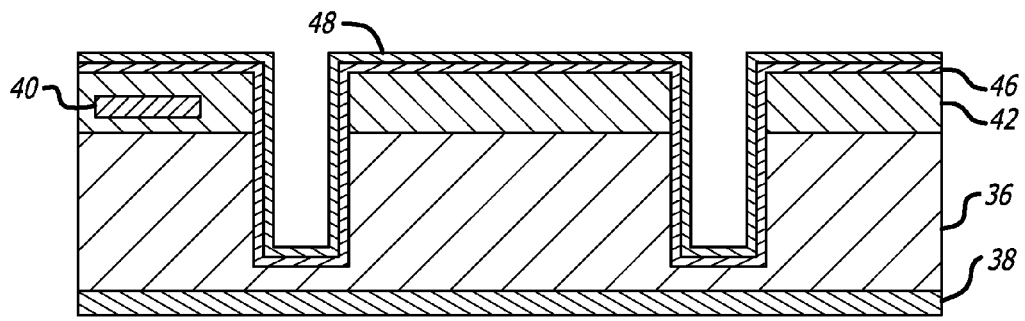
Figure 9:
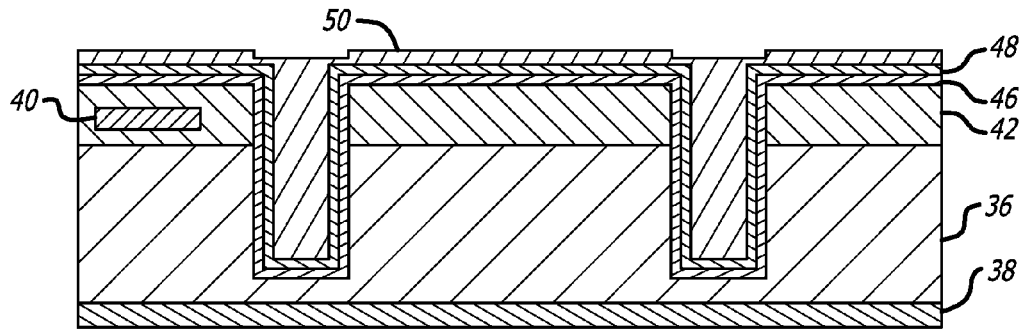
Figure 10:
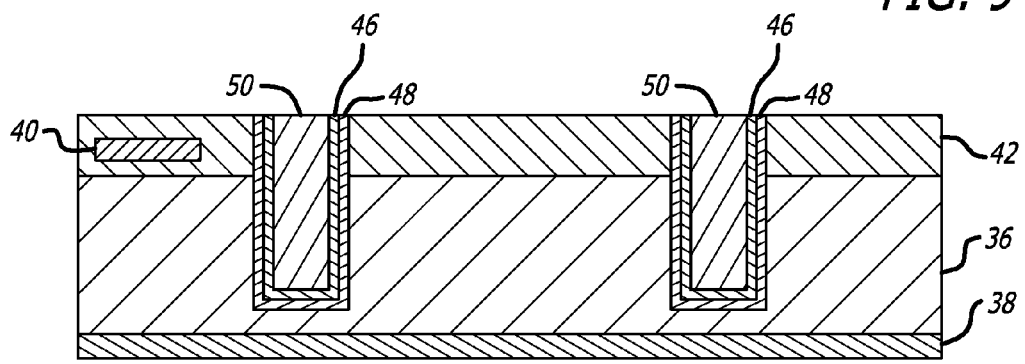

The structure of FIG. 3 is then coated with a hard mask layer 44 and patterned as shown in FIG. 4 using a conventional photomask and etching process. Thereafter, a silicon trench type etch using a standard commercial process is made, as shown in FIG. 5. Then the photoresist is stripped as shown in FIG. 6 and an oxide layer 46 is deposited as shown in FIG. 7. That layer is then coated with a barrier seed layer 48 as shown in FIG. 8 and a layer of copper 50 is electroplated to fill the holes in the silicon substrate 36, at least to a level above the top of the oxide layers 40, as shown in FIG. 9. Then a chemical mechanical polishing (CMP) process is used to remove the copper layer 50, the oxide layer 48 and barrier seed layer 46 between the holes in the substrate 36 that are now filled with copper, as shown in FIG. 10.

Figure 11:
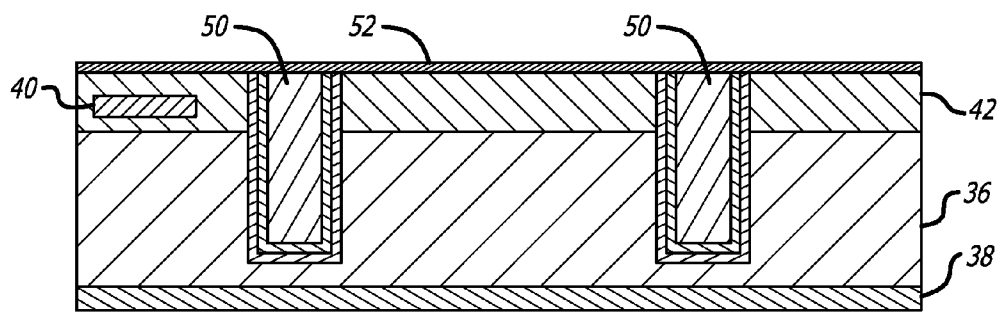
Figure 12:
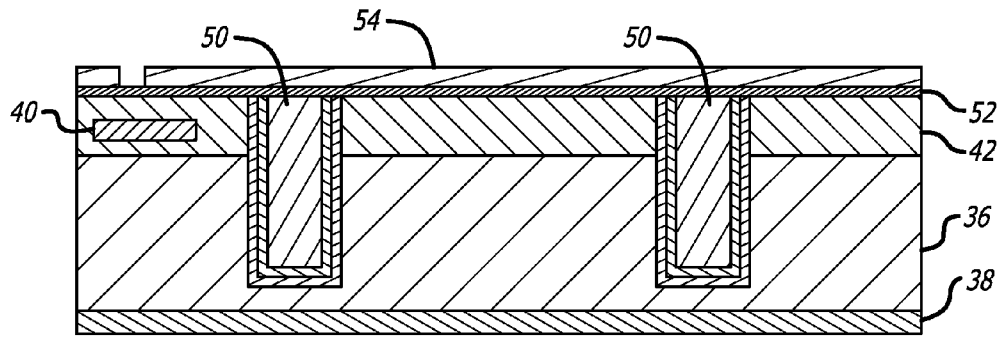
Figure 13:
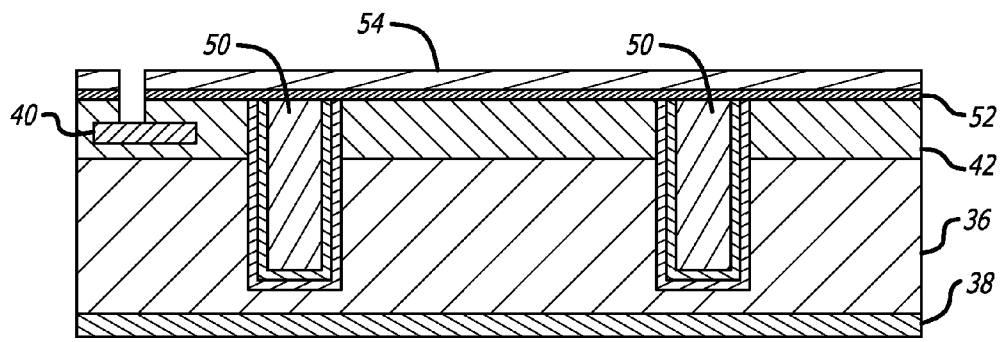
Figure 14:
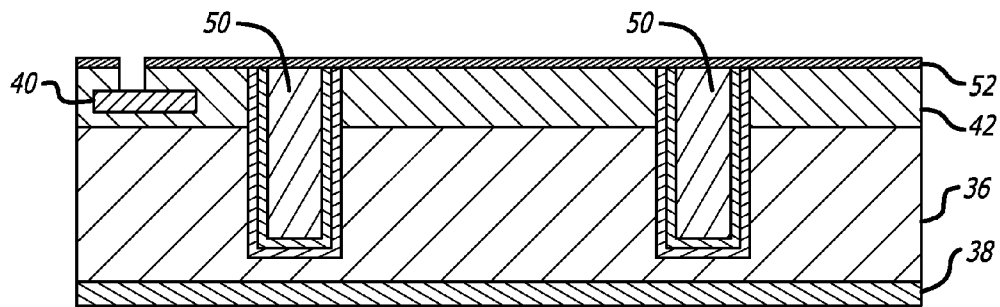
Figure 15:
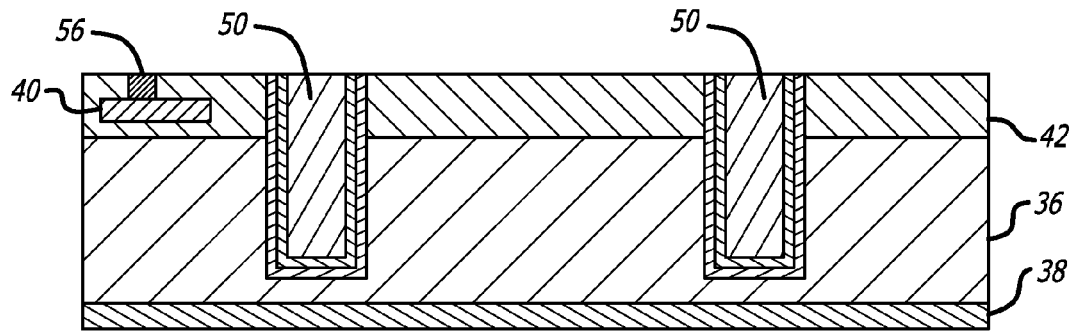

The next step in the exemplary process is to deposit a stop layer 52 as shown in FIG. 11, then apply and pattern a photoresist layer 54 as shown in FIG. 12 and etch down to the interconnect layer 40 as shown in FIG. 13. Then the photoresist layer 54 is stripped as shown in FIG. 14, a metal layer is deposited to fill the opening created by the etch, and a further CMP is used to remove stop layer 52 and the excess metal, leaving metal 56 contacting interconnect 40 as shown in FIG.

Figure 16:
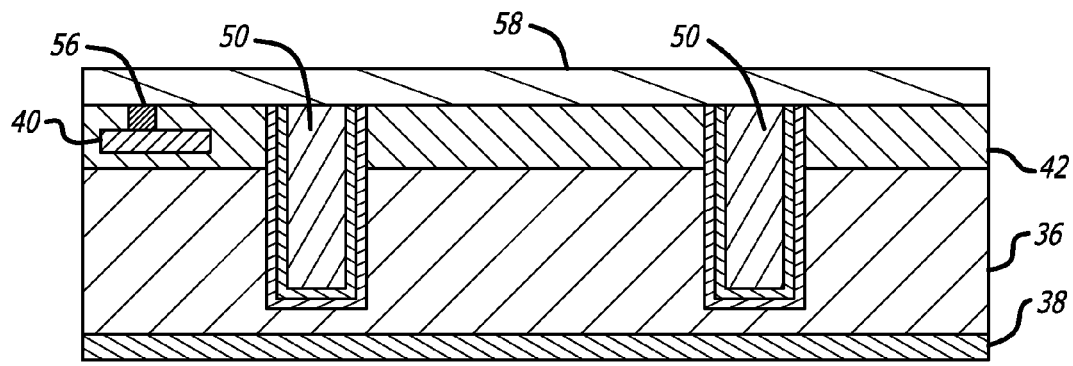
Figure 17:
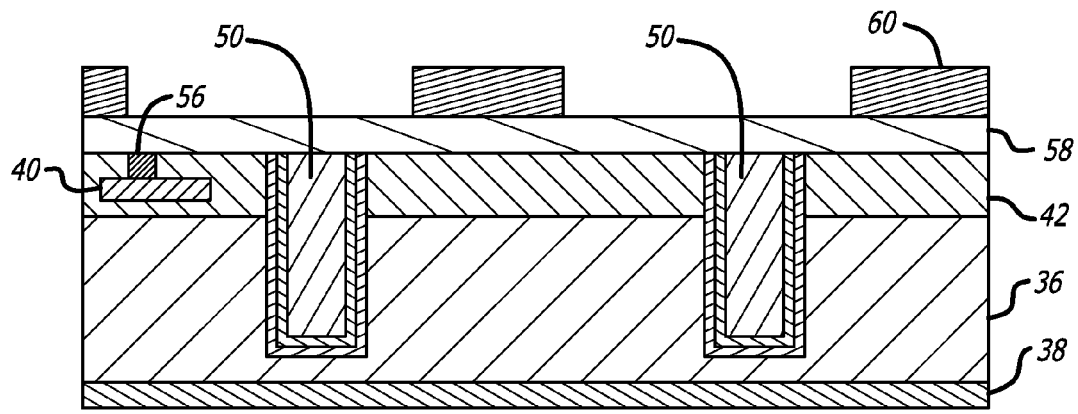
Figure 18:
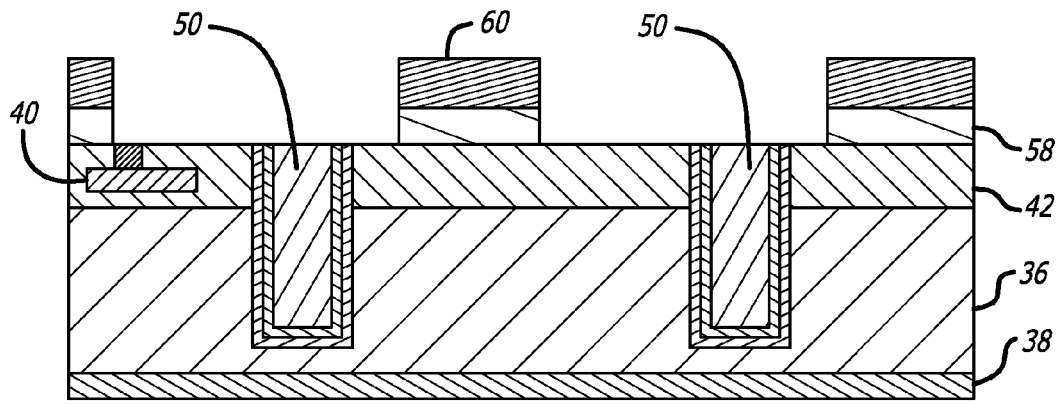
Figure 19:
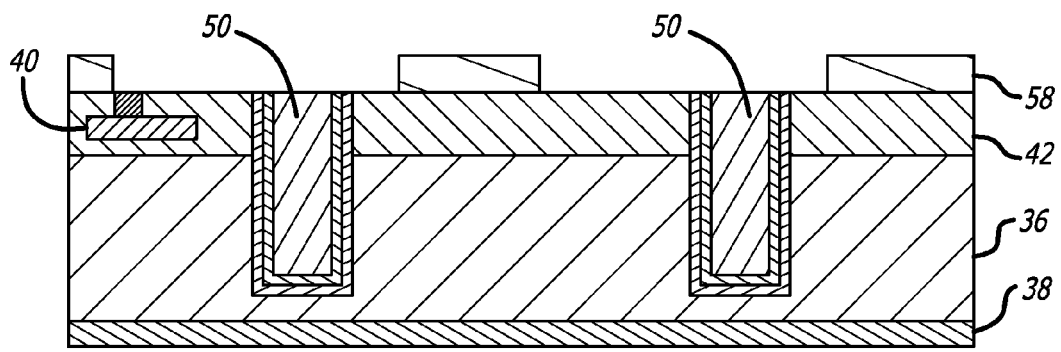
Figure 20:
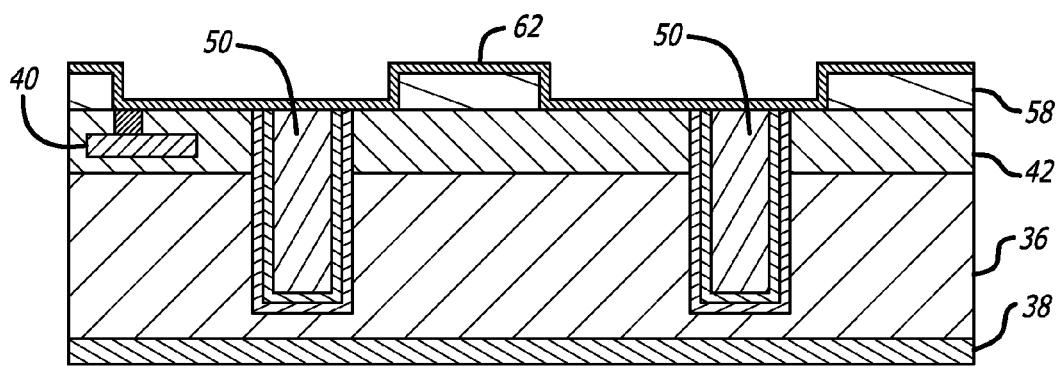
Figure 21:
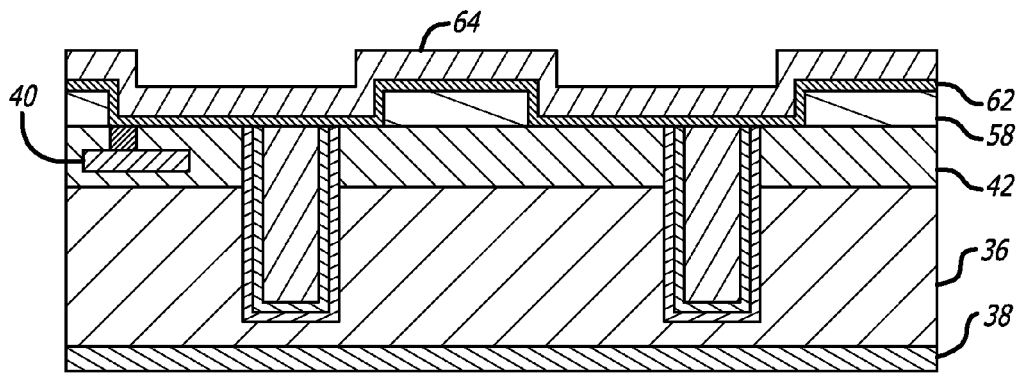
Figure 22:
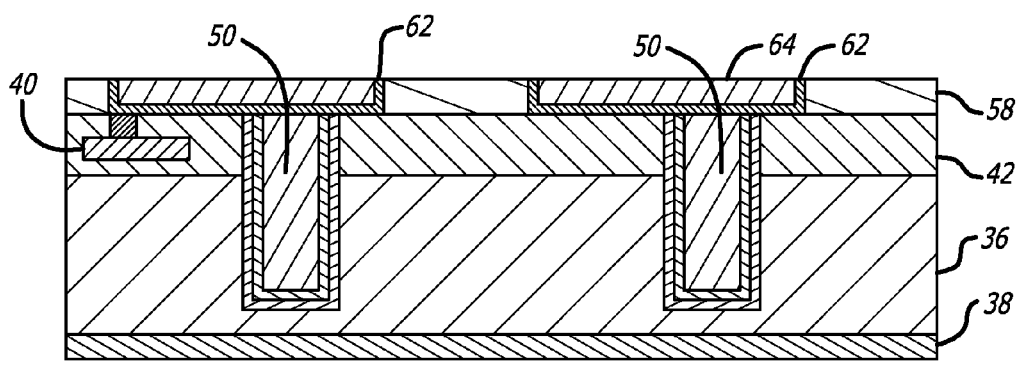

15. Then an oxide layer 58 is deposited as shown in FIG. 16 and a photoresist layer 60 is then spun on the wafer in a standard manner and patterned as shown in FIG. 17. The oxide layer 58 is then etched through the photoresist (FIG. 18) and the photoresist removed as shown in FIG. 19. Thereafter a metal barrier seed layer 62 is deposited as shown in FIG. 20, followed by a copper layer 64 sufficiently thick to fill the etched regions in the oxide layer 58, as shown in FIG. 21. This is followed by another CMP to remove the copper and the metal barrier seed layer between filled regions 64 as shown in FIG. 22. This forms regions 34 and 32 in the coil of FIG. 2 (as can be seen in FIG. 2, the region 32 of FIG. 22 angles out of the view plane of this cross section).

Figure 23:
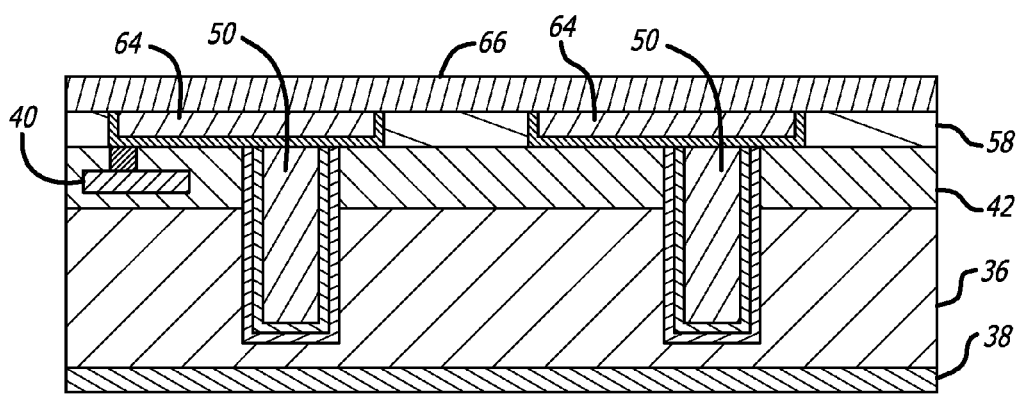
Figure 24:
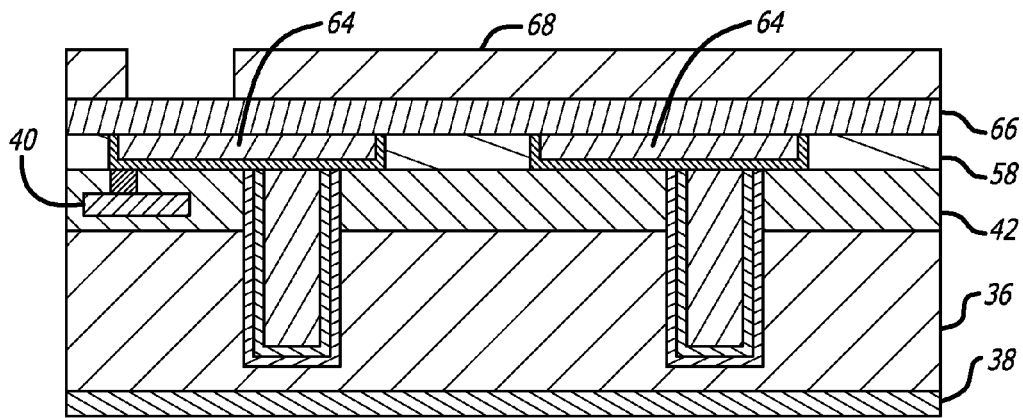
Figure 25:
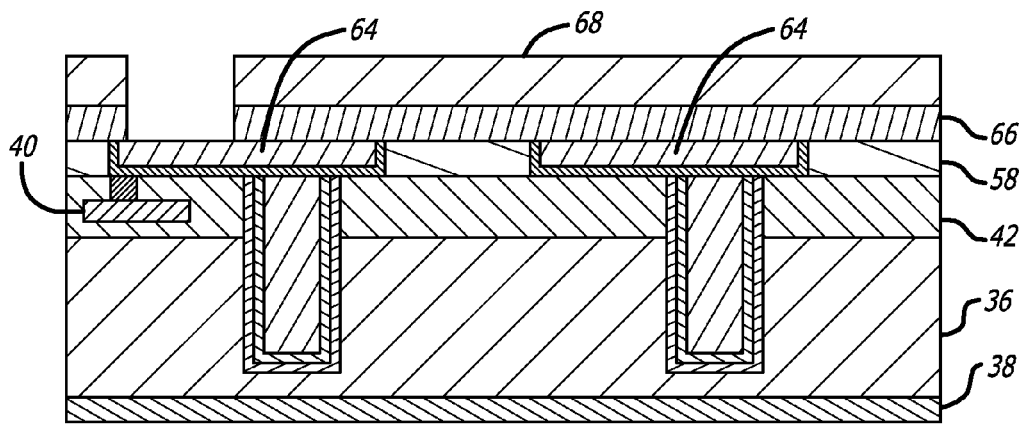
Figure 26:
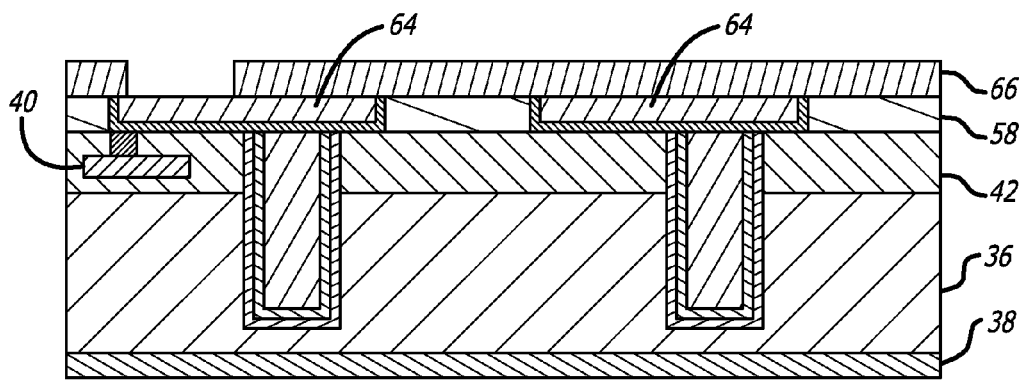

Thereafter a passivation oxide layer 66 is deposited as shown in FIG. 23, a photoresist layer 68 is applied and patterned as shown in FIG. 24, openings are etched to allow contact to one or both regions 34 and other integrated circuit contacts as needed (FIG. 25) and the photoresist layer is removed (FIG. 26). Note that in FIG. 24, region 34 is electrically accessible from the top of the wafer and is also electrically connected to the IC metal interconnect layer 40. Depending on the circuit design, either one of these connections may not be present. By way of example, if the coil is in series with an output terminal and this end of the coil is to form the output terminal, connection of region 34 to the metal interconnect layer 40 would not be present, and if the coil is connected entirely to internal circuitry, the access through the passivation layer would not be provided.

Figure 27:
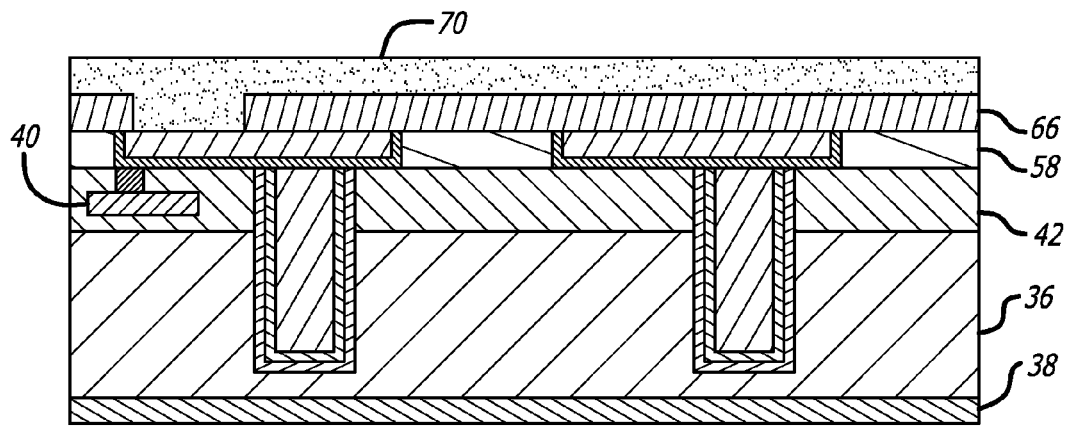
Figure 28:
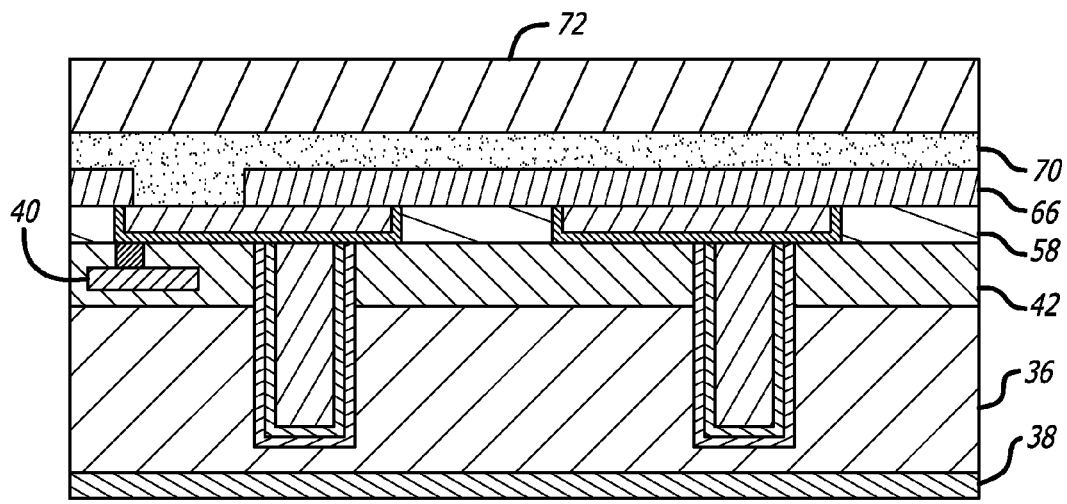
Figure 29:
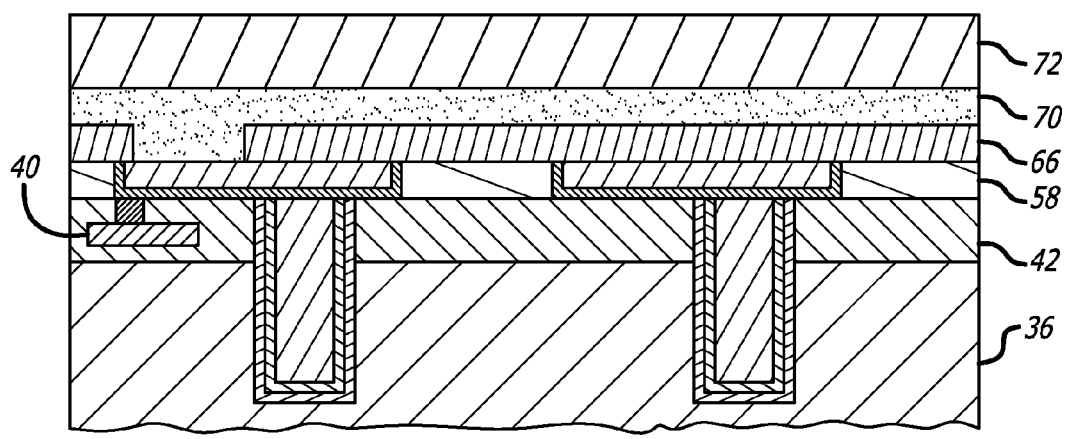
Figure 30:
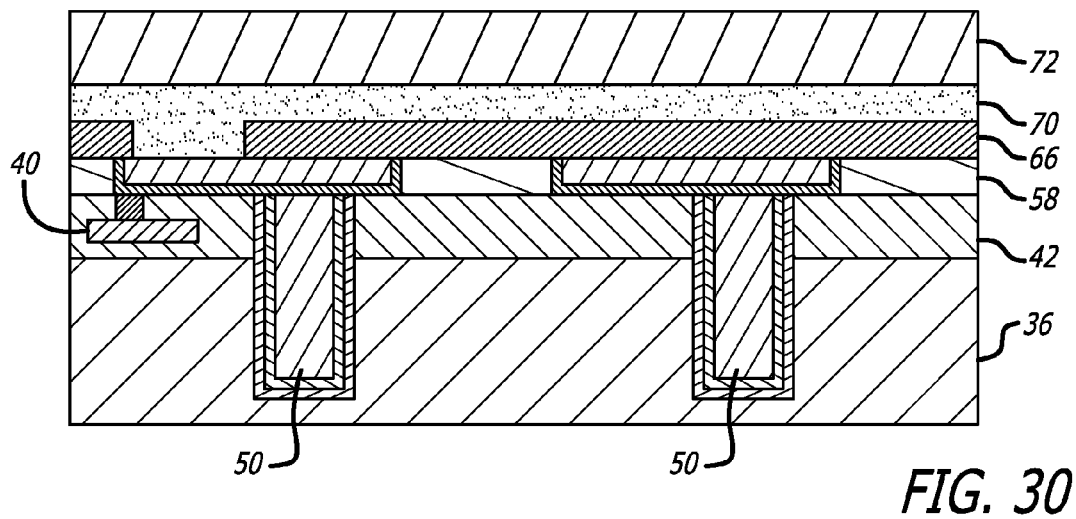
Figure 31:
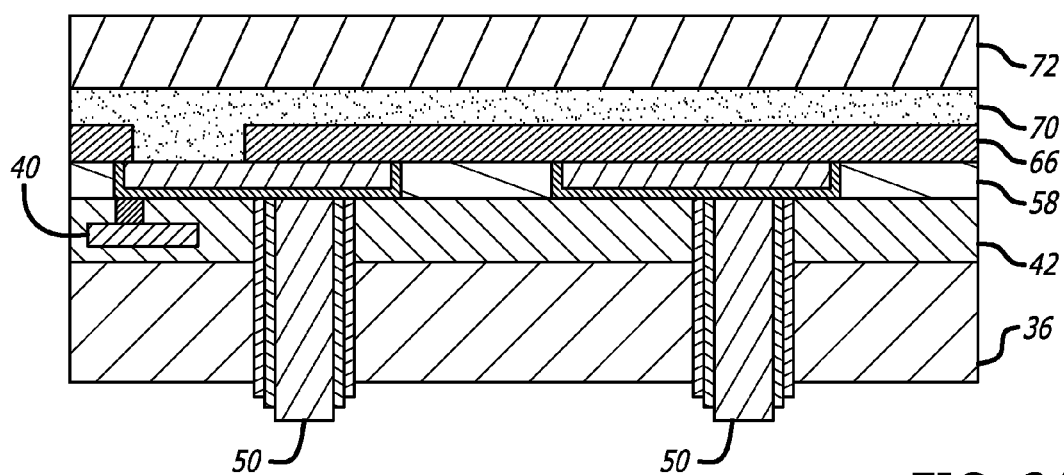
Figure 32:
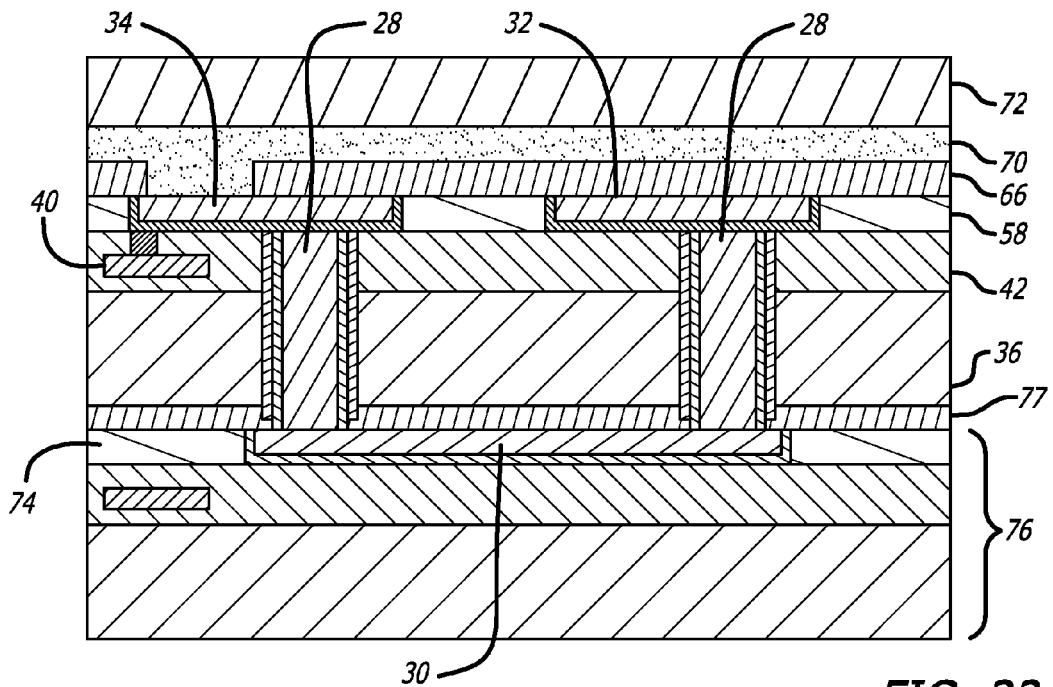
FIGS. 32 and 33 are local cross sections illustrating the bonding of two wafers in accordance with an embodiment of the present invention.
Figure 33:
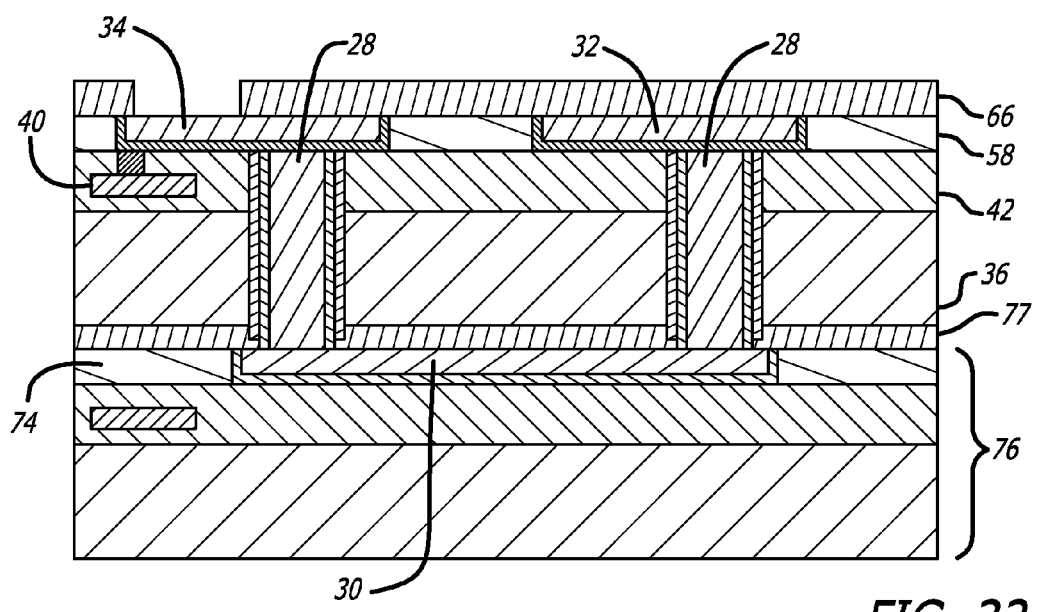

Now a temporary glue layer 70 is deposited (FIG. 27) and the wafer is temporarily bonded to a carrier 72 as shown in FIG. 28. Then the opposite side of the substrate of wafer 36 is thinned by a coarse grind (FIG. 29) and then given a fine polish using CMP (FIG. 30). A silicon plasma etch is then used to expose the ends of copper 50 (vertical members 28 in FIG. 2) as shown in FIG. 31, and then the lower end of copper vertical members 50 are thermo-compression bonded to copper horizontal members 30 (see also FIG. 2) accessible through a passivation oxide layer 74 on another integrated circuit wafer 76 (FIG. 32). The copper horizontal members 30 are separated by a photo-defined polymer, layer 77 in FIG. 32. This layer 77 serves two main purposes. Primarily, it serves as a strong adhesive layer between the top wafer and the bottom wafer. It also serves as a stress-distribution level during thermo-compression bonding. The left copper layer 64 is a region 34 of FIG. 2 and the right copper layer 64 is a region 32 of FIG. 2. Thereafter the temporary carrier 72 and the glue layer 70 are removed to provide the structure of FIG. 33 wherein the two silicon wafers are physically and electrically interconnected, both of which wafers may include integrated circuits with an inductor coil being formed by the combination of conductors extending entirely through the upper silicon wafer (as thinned) and interconnected at the top and bottom of the upper wafer to form the inductor coil, in the embodiment described being interconnected at the bottom by the pattern of copper regions on the lower substrate. Alternatively the lower interconnection of the copper vertical members 28 could be made by depositing and patterning a copper layer on the bottom of the first wafer by a photoresist process or CMP, though it is preferred to interconnect the copper vertical members 28 using a patterned layer of copper on the second wafer, as a patterned copper layer is needed on the second wafer anyway for thermo-compression bonding of the two wafers together.

Figure 34:
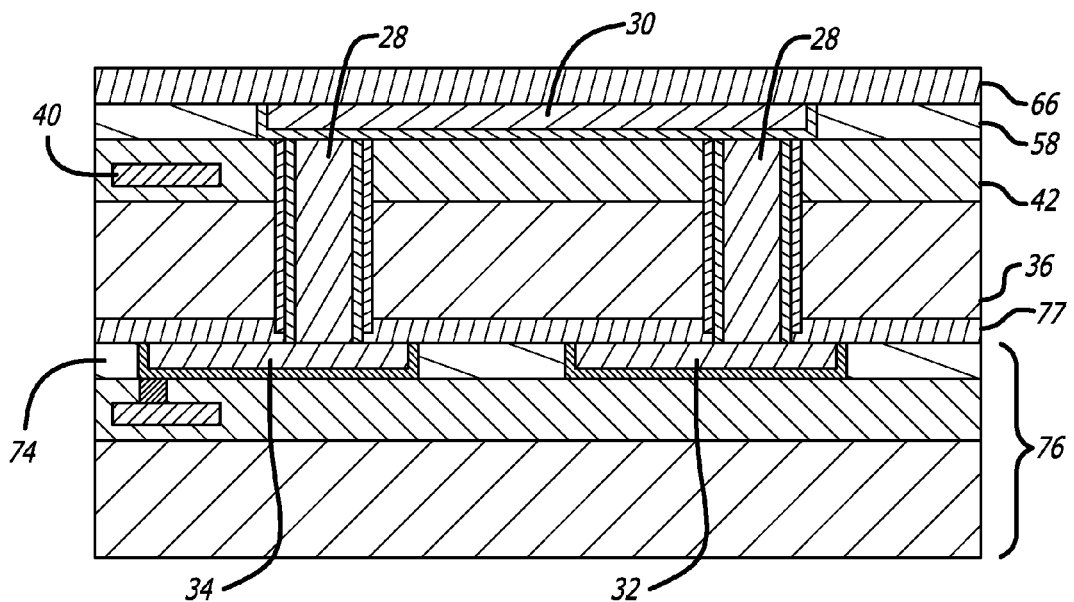
FIG. 34 illustrates the coupling of an inductor to circuitry on a second wafer.

Now referring to FIG. 34, an alternate embodiment of the inductor coil of the present invention may be seen. In the embodiment previously described one (or both) coil leads is accessible through the top of the upper wafer. In the embodiment of FIG. 34, the inductor coil is not externally accessible but rather is flipped so that potentially both inductor leads 34 (see also FIG. 2) are internally connected to the integrated circuit 76. Thus one, both or none of the inductor leads may be made externally accessible, depending on the circuit being fabricated.

Figure 35:
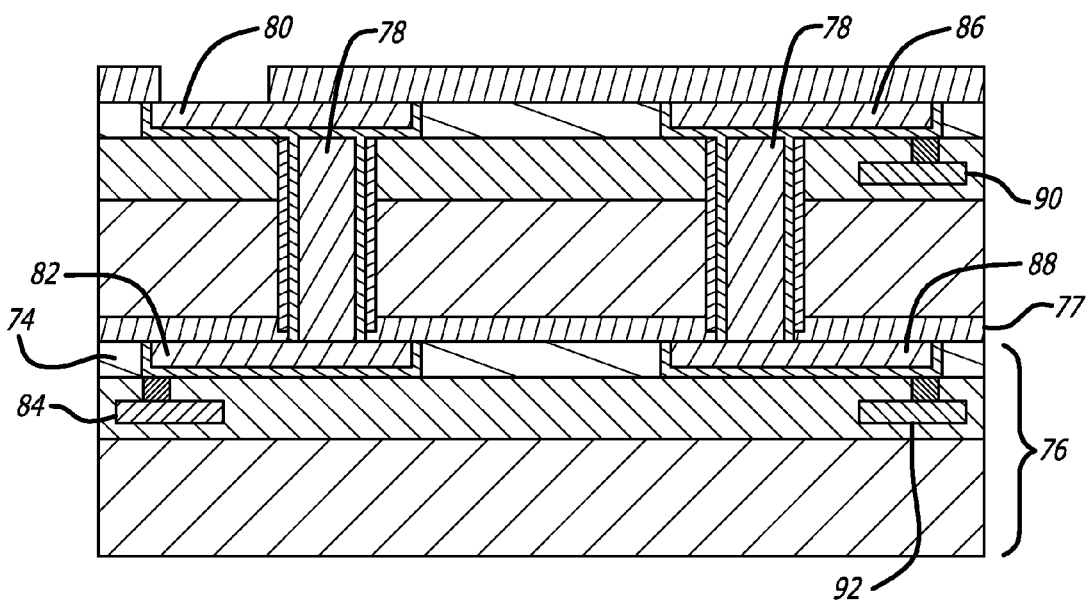
FIG. 35 illustrates the coupling of circuitry on a bottom wafer through an upper wafer for connection to external circuitry, and the coupling of circuitry on a bottom wafer to circuitry on the upper wafer.

FIG. 35 illustrates, at the left side thereof, how connections to the integrated circuit on the lower wafer are made accessible through the top of the upper wafer, and on the right thereof, how interconnections are made to the integrated circuits on the two wafers. In both cases, copper members 78 form vias through the upper substrate to connect copper member 80 and 82 to interconnect copper member 80 with the integrated circuit metal interconnect 84, and at the right, to interconnect copper members 86 and 88 to interconnect integrated circuit metal interconnects 90 and 92. Thus using the methods of the present invention, all required externally accessible connections to the integrated circuits on both wafers are accessible through the top of the upper wafer, and are ready for solder bumping or wire bonding and dicing. Simultaneously, all required interconnection between wafers and connections to the inductor leads are made through the same process.

In a preferred embodiment, the final thickness of the upper wafer is approximately 100 microns, with the vertical members 28 (FIG. 2) having a diameter of approximately 5 microns, thus providing an aspect ratio of approximately 20 to 1. However such dimensions and aspect ratio are not limitations of the invention. Also the upper wafer, if silicon, should be substantially pure silicon which has a very high resistivity at ordinary operating temperatures. Of course doped regions may be formed in other parts of the upper wafer for providing other integrated circuit components therein.

As a further alternative, substrate 36 in FIGS. 3 through 28 may be silicon with a thick oxide layer thereon, with the silicon subsequently being removed to leave the substrate in FIG. 31 and subsequent Figures as a silicon oxide substrate. Other starting substrates might also potentially be used, such as by way of example, glass or ceramic. In any case, the resulting inductor coil, having an axis parallel to the plane of the substrate and coils extending all the way through the substrate, can have a substantial length in comparison to the prior art, yet still occupy a very small substrate area, allowing the realization of one or more inductors along with other passive or active elements on the upper substrate within an area consistent with the area of a typical integrated circuit in the lower substrate, allowing wafer to wafer bonding without significant wafer area waste as described, followed by solder bumping at the top of the upper wafer for making all connections to circuitry on both wafers, after which the pair of wafers may be diced to separate the multiple devices or integrated circuits on the wafers, and packaged.

Thus the present invention has a number of aspects, which aspects may be practiced alone or in various combinations or sub-combinations, as desired. While preferred embodiments of the present invention have been disclosed and described herein for purposes of illustration and not for purposes of limitation, it will be understood by those skilled in the art that various changes in form and detail may be made therein without departing from the spirit and scope of the invention as defined by the full breadth of the following claims.

What is claimed is:

1. An integrated inductor comprising:
   a first substrate having a plurality of holes through the first substrate, the holes being filled with an electrically conductive material so as to be accessible from a first surface of the first substrate;

the electrically conductive material in pairs of holes being electrically interconnected at a second surface of the first substrate;

a second substrate having a plurality of electrically conductive areas embedded in and exposed on a first surface thereof;

the electrically conductive material accessible from a first surface of the first substrate being interconnected to the conductive areas on the first surface of the second substrate without a gap there between to form a multiple turn inductor coil having an inductor axis parallel to the first surface of the substrate.

2. The integrated inductor of claim 1 wherein the second substrate is a semiconductor substrate having an integrated circuit thereon coupled to the inductor coil.

3. The integrated inductor of claim 2 wherein some of the electrically conductive material filling holes in the first substrate are interconnected with the integrated circuit and not the coil, whereby integrated circuit connections on the second substrate are accessible from the second surface of the first substrate.

4. The integrated inductor of claim 2 wherein the first substrate is an oxide.

5. The integrated inductor of claim 1 wherein the first substrate is a semiconductor substrate.

6. The integrated inductor of claim 5 wherein the electrically conductive material filling the holes, the electrical interconnection at a second surface of the first substrate and the interconnection to form the inductor are electrically insulated from the first substrate.

7. The integrated inductor of claim 5 wherein the first substrate includes an integrated circuit thereon.

8. The integrated inductor of claim 1 wherein the electrically conductive material filling the holes, the electrical interconnection at a second surface of the first substrate and the interconnection to faun the inductor are copper.

9. An integrated inductor comprising:
a first substrate having a plurality of holes through the first substrate, the holes being filled with an electrically conductive material so as to be accessible from a first surface of the first substrate;

the electrically conductive material in at least one pair of holes being electrically interconnected at a second surface of the first substrate;

a second substrate having at least one electrically conductive area embedded in and exposed on a first surface thereof;

the electrically conductive material accessible from a first surface of the first substrate in at least one pair of holes being interconnected to a respective conductive area on the first surface of the second substrate without a gap there between to form an inductor coil having an inductor axis parallel to the first surface of the substrate.

10. The integrated inductor of claim 9 wherein the second substrate is a semiconductor substrate having an integrated circuit thereon coupled to the inductor coil.

11. The integrated inductor of claim 10 wherein some of the electrically conductive material filling holes in the first substrate are interconnected with the integrated circuit and not the coil, whereby integrated circuit connections on the second substrate are accessible from the second surface of the first substrate.

12. The integrated inductor of claim 10 wherein the first substrate is an oxide.

13. The integrated inductor of claim 9 wherein the first substrate is a semiconductor substrate.

14. The integrated inductor of claim 13 wherein the electrically conductive material filling the holes, the electrical interconnection at a second surface of the first substrate and the interconnection to form the coil are electrically insulated from the first substrate.

15. The integrated inductor of claim 13 wherein the first substrate includes an integrated circuit thereon.

16. The integrated inductor of claim 9 wherein the electrically conductive material filling the holes, the electrical interconnection at a second surface of the first substrate and the interconnection to form the inductor are copper.

* * * * *